United States Patent
Odnoblyudov et al.

(10) Patent No.: US 11,335,557 B2
(45) Date of Patent: *May 17, 2022

(54) MULTI-DEPOSITION PROCESS FOR HIGH QUALITY GALLIUM NITRIDE DEVICE MANUFACTURING

(71) Applicant: QROMIS, Inc., Santa Clara, CA (US)

(72) Inventors: Vladimir Odnoblyudov, Danville, CA (US); Cem Basceri, Los Gatos, CA (US)

(73) Assignee: QROMIS, INC., Santa Clara, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 16/862,255

(22) Filed: Apr. 29, 2020

(65) Prior Publication Data
US 2020/0258741 A1    Aug. 13, 2020

Related U.S. Application Data

(63) Continuation of application No. 15/621,413, filed on Jun. 13, 2017, now Pat. No. 10,679,852.
(Continued)

(51) Int. Cl.
| | |
|---|---|
| *H01L 21/02* | (2006.01) |
| *C30B 25/02* | (2006.01) |
| *H01L 29/20* | (2006.01) |
| *H01L 23/00* | (2006.01) |
| *C30B 29/40* | (2006.01) |
| *C30B 29/68* | (2006.01) |
| *H01L 21/78* | (2006.01) |
| *H01L 21/205* | (2006.01) |

(52) U.S. Cl.
CPC ........ *H01L 21/02694* (2013.01); *C30B 25/02* (2013.01); *C30B 29/406* (2013.01); *C30B 29/68* (2013.01); *H01L 21/0254* (2013.01); *H01L 21/0262* (2013.01); *H01L 21/02367* (2013.01); *H01L 21/02381* (2013.01); *H01L 21/02433* (2013.01); *H01L 21/02458* (2013.01); *H01L 21/02507* (2013.01); *H01L 21/7806* (2013.01); *H01L 23/562* (2013.01); *H01L 29/2003* (2013.01); *H01L 21/2056* (2013.01)

(58) Field of Classification Search
CPC ............... H01L 21/02381; H01L 21/02367
See application file for complete search history.

(56) References Cited

U.S. PATENT DOCUMENTS 6,497,763 B2 * 12/2002 Kub ................ H01L 21/2007
                                          117/915
8,697,541 B1    4/2014   Kumar
(Continued)

OTHER PUBLICATIONS

Non-Final Rejection in related U.S. Appl. No. 15/621,413, dated May 18, 2018 (seven pages).
(Continued)

*Primary Examiner* — Farun Lu
(74) *Attorney, Agent, or Firm* — Kilpatrick Townsend & Stockton LLP

(57) ABSTRACT

A group III-nitride (III-N)-based electronic device includes an engineered substrate, a metalorganic chemical vapor deposition (MOCVD) III-N-based epitaxial layer coupled to the engineered substrate, and a hybrid vapor phase epitaxy (HVPE) III-N-based epitaxial layer coupled to the MOCVD epitaxial layer.

20 Claims, 7 Drawing Sheets

Related U.S. Application Data

(60) Provisional application No. 62/349,211, filed on Jun. 13, 2016.

(56) References Cited

U.S. PATENT DOCUMENTS

| | | | |
|---|---|---|---|
| 9,082,692 | B2 | 7/2015 | Odnoblyudov et al. |
| 9,650,723 | B1* | 5/2017 | D'Evelyn ............ H01L 21/2007 |
| 10,679,852 | B2* | 6/2020 | Odnoblyudov ... H01L 21/02367 |
| 2006/0099776 | A1* | 5/2006 | Dupont ............. H01L 21/76254 |
| | | | 438/479 |
| 2011/0147772 | A1 | 6/2011 | Lochtefeld et al. |
| 2011/0204376 | A1* | 8/2011 | Su ......................... H01L 27/156 |
| | | | 257/76 |
| 2012/0161289 | A1 | 6/2012 | Werkhoven |
| 2013/0175541 | A1* | 7/2013 | Park .................. H01L 21/02381 |
| | | | 257/76 |
| 2014/0327013 | A1 | 11/2014 | Schenk et al. |
| 2014/0361337 | A1 | 12/2014 | Sugiyama et al. |
| 2015/0090956 | A1 | 4/2015 | Coones et al. |
| 2016/0372628 | A1 | 12/2016 | Henley et al. |
| 2018/0005827 | A1 | 1/2018 | Odnoblyudov et al. |

OTHER PUBLICATIONS

Notice of Allowance in related U.S. Appl. No. 15/621,413, dated Jan. 11, 2019 (eight pages).
Non-Final Rejection in related U.S. Appl. No. 15/621,413, dated Jul. 12, 2019 (21 pages).
Final Rejection in related U.S. Appl. No. 15/621,413, dated Nov. 4, 2019 (22 pages).
Notice of Allowance in related U.S. Appl. No. 15/621,413, dated Feb. 11, 2020 (eleven pages).

* cited by examiner

MULTI-DEPOSITION PROCESS FOR HIGH QUALITY GALLIUM NITRIDE DEVICE MANUFACTURING

CROSS-REFERENCES TO RELATED APPLICATIONS

This application is a continuation of U.S. patent application Ser. No. 15/621,413, filed Jun. 13, 2017, now U.S. Pat. No. 10,679,852, which claims priority to U.S. Provisional Patent Application No. 62/349,211, filed on Jun. 13, 2016, entitled "MULTI-DEPOSITION PROCESS FOR HIGH QUALITY GALLIUM NITRIDE DEVICE MANUFACTURING," the disclosures of which are hereby incorporated by reference in its entirety for all purposes.

BACKGROUND OF THE INVENTION

Wide band gap (WBG) semiconductor devices are expensive and time consuming to manufacture. For example, gallium nitride (GaN) materials in a majority of cases are formed by a heteroepitaxial (epi) growth process where GaN is deposited on a semiconductor carrier substrate having a different lattice structure (or lattice constant) than the deposited GaN. The lattice mismatch between the GaN and the carrier substrate may create defects, dislocations, and strains that negatively impact device yields and performance.

More detrimental, the GaN layers and carrier substrate may have different coefficients of thermal expansion (CTE). Thermal processing (e.g. GaN epitaxial growth) can crack or delaminate the GaN or bow, and in some cases break, the carrier substrate. The different CTEs restrict substrate wafer size limiting scale and preventing reduction of the overall manufacturing cost of WBG devices and solutions. Thus, GaN technology is currently limited to discrete devices with no large scale integration (LSI) circuitry.

SUMMARY OF THE INVENTION

Embodiments of the present invention relate to wide bandgap devices. In a particular embodiment, methods of fabricating epitaxial structures are utilized to form high quality epitaxial layers that are thick enough to support a variety of electronics applications. As an example, a III-N epitaxial structure is formed using different epitaxial growth techniques to provide differing growth rates and crystal characteristics.

According to an embodiment of the present invention, a group III-nitride (III-N)-based electronic device is provided. The electronic device includes an engineered substrate and a metalorganic chemical vapor deposition (MOCVD) III-N-based epitaxial layer coupled to the engineered substrate. The engineered substrate also includes a hybrid vapor phase epitaxy (HVPE) III-N-based epitaxial layer coupled to the MOCVD epitaxial layer.

According to another embodiment of the present invention, a method of fabricating a epitaxial structure is provided. The method includes providing an engineered substrate and growing a first epitaxial layer coupled to the engineered substrate using a first deposition process. The method also includes growing a second epitaxial layer coupled to the first epitaxial layer using a second deposition process.

According to another embodiment of the present invention, a method of forming a GaN-based epitaxial structure is provided. The method includes providing an engineered substrate and depositing a first GaN-based epitaxial layer coupled to the engineered substrate using a metalorganic chemical vapor deposition (MOCVD) process. The method also includes depositing a second GaN-based epitaxial layer coupled to the first GaN-based epitaxial layer using a hybrid vapor phase epitaxy (HVPE) deposition process.

Numerous benefits are achieved by way of the present invention over conventional techniques. For example, embodiments of the present invention provide $Al_xGa_{1-x}N$-based epitaxial layers that have properties of bulk-like $Al_xGa_{1-x}N$ on large diameter engineered substrates (6 inch, 8 inch, 12 inch, or larger). Embodiments provide bulk-like GaN epitaxial structures that are substantially less expensive to manufacture than conventional techniques. These and other embodiments of the invention along with many of its advantages and features are described in more detail in conjunction with the text below and attached figures.

DETAILED DESCRIPTION OF SPECIFIC EMBODIMENTS

In the following detailed description, references are made to the accompanying drawings, which form a part of the description and in which are shown, by way of illustration, specific implementations. Although the disclosed implementations are described in sufficient detail to enable one skilled in the art to practice the implementations, it is to be understood that these examples are not limiting, such that other implementations may be used and changes may be made to the disclosed implementations without departing from their spirit and scope.

Figure 1:
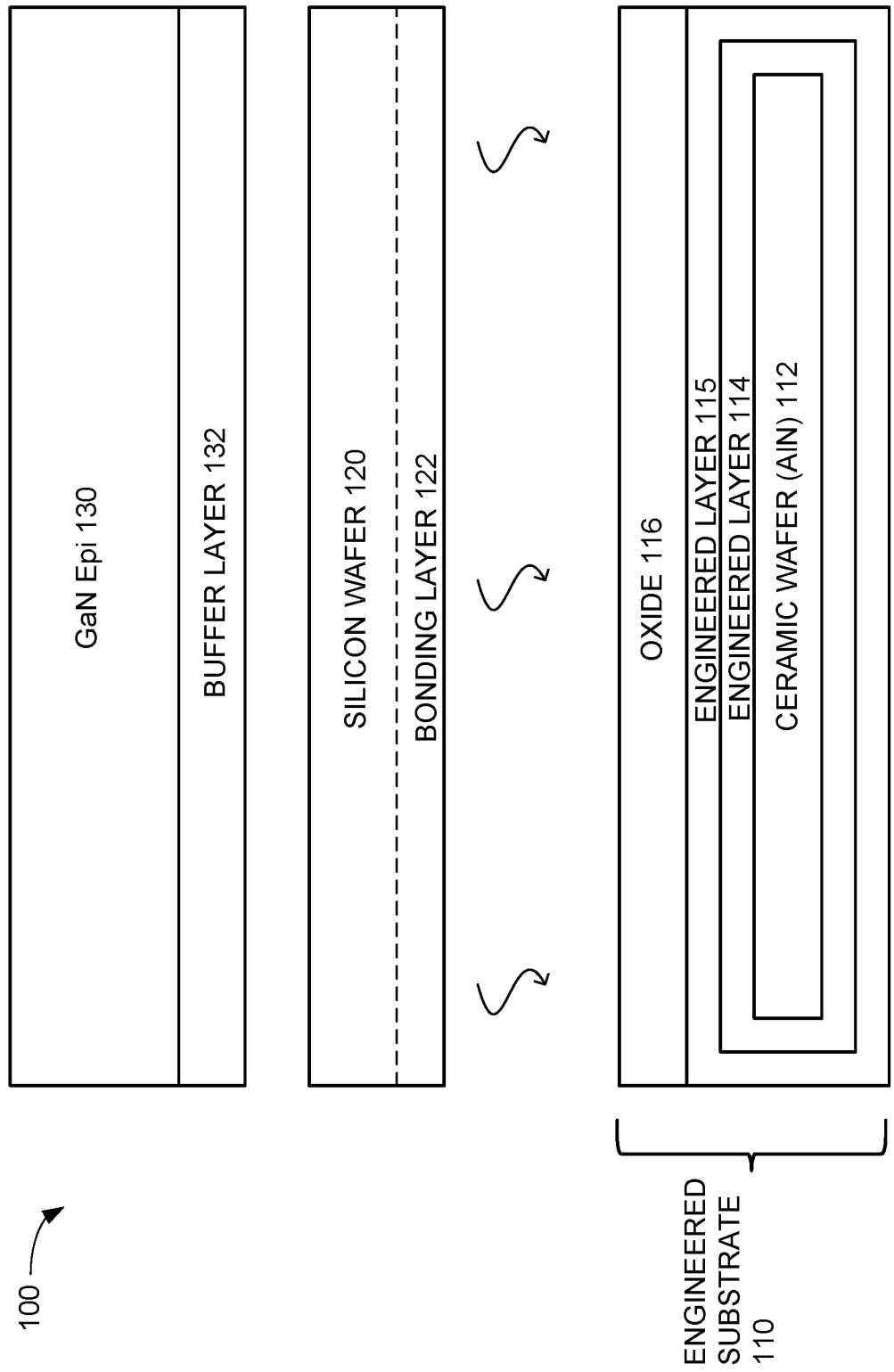
FIG. 1 is a side sectional view illustrating GaN epitaxial (i.e., epi) layers formed on an engineered substrate according to an embodiment of the present invention.

FIG. 1 is a side sectional view illustrating GaN epitaxial (i.e., epi) layers 130 formed on an engineered substrate (ES) 110 according to an embodiment of the present invention. Epi layers 130 can contain a single layer, multiple layers, or multiple sub-layers of a single material, or multiple sub-layers of different materials. Manufacturing of ES 110 begins with a ceramic polycrystalline wafer 112, such as aluminum nitride (AlN). Ceramic wafer 112 may comprise other polycrystalline materials, such as silicon carbide (SiC), gallium nitride (GaN), or aluminum gallium nitride (AlGaN).

A series of engineered layers 114 and 115 are deposited onto ceramic wafer 112, such as layers of oxide, nitride, and polysilicon. Engineered layers 114 and 115, which can include one or more sub-layers, provide adhesion, defectivity management, and a diffusion barrier for subsequent GaN epi layers 130. Additional description related to elements of ES 110 are provided in relation to FIG. 7. Although only two engineered layers 114 and 115 are illustrated, embodiments of the present invention are not limited to two layers and may include additional layers. An additional oxide layer 116 may be deposited on one side of ceramic wafer 112. A portion of oxide layer 116 is polished back with a chemical mechanical planarization (CMP) process to create a smooth surface for subsequent wafer bonding.

A layer transfer process is performed using a silicon wafer 120. Silicon wafer 120 is implanted with one or more elements to create a damage interface inside the silicon material, which helps form a silicon bonding layer 122, which can be a monocrystalline silicon layer for attaching to oxide layer 116. Silicon wafer 120 is atomically bonded to oxide layer 116 during the layer transfer process. In another example, an IC architecture may use a different bonding layer 122 such as, sapphire or SiC.

After the bonding process, thermal treatment activates the damage interface inside the silicon wafer, causing the implanted elements to form bubbles along the implant interface in wafer 120. These bubbles (e.g., clusters) expand and ultimately split off the top portion of silicon wafer 120 onto ceramic wafer 112 with engineered layers 114/115 and oxide layer 116.

The bonding layer 122, for example, single crystal silicon, which is bonded to oxide layer 116 is relatively thin at around less than 5 µm and therefore does not significantly contribute to the CTE properties of ES 110. CTE properties of ES 110 are therefore substantially determined by CTE coefficients of ceramic wafer 112. Materials other than silicon may be used to create bonding layer 122. These can include single crystal materials such as SiC, GaN, AlGaN, AlN, ZnO, sapphire and other.

GaN epitaxial layers (epi layers) 130 are applied on top of ES 110. Ceramic wafer 112 and epi layers 130 are substantially CTE matched over a wide temperature range (25° C.-1200° C.). This CTE matching enables formation of thicker, higher quality epi layers 130 on a larger sized ceramic wafer 112 without cracking or warping. For example, epi layers 130 may be formed on an ES 110 of various sizes including 6 inch, 8 inch, 12 inch, or larger. Fabrication of larger wafers increases device count per wafer resulting in less expensive GaN device fabrication.

CTE matching also enables formation of significantly thicker epi layers 130 (tens or hundreds of microns) on top of ES 110. The thicker combination of epi layers 130 may reduce the overall dislocation density for the lattice structures between epi layers 130 and silicon bonding layer 122. A thicker epi layer will allow a larger drift region with lower defect density, which results in higher breakdown voltage with very low leakage currents. The larger number of epi layers 130 also support more complex circuitry and more integration for a wider array of GaN applications.

Other example engineered substrates and other epi structures are described in the following U.S. patents which are hereby incorporated by reference in their entirety, U.S. Pat. Nos. 7,358,152; 7,535,100; 6,593,212; 6,497,763; 6,328, 796; 6,323,108; U.S. Ser. No. 12/836,970; U.S. Ser. No. 13/732,739; U.S. Ser. No. 13/223,162; U.S. Ser. No. 13/732, 934; U.S. Ser. No. 12/969,302; U.S. Ser. No. 12/836,970; U.S. Pat. Nos. 8,436,362; 8,729,563; U.S. Ser. No. 14/282, 406, and U.S. Ser. No. 15/367,108, filed on Jan. 1, 2016.

Figure 2:
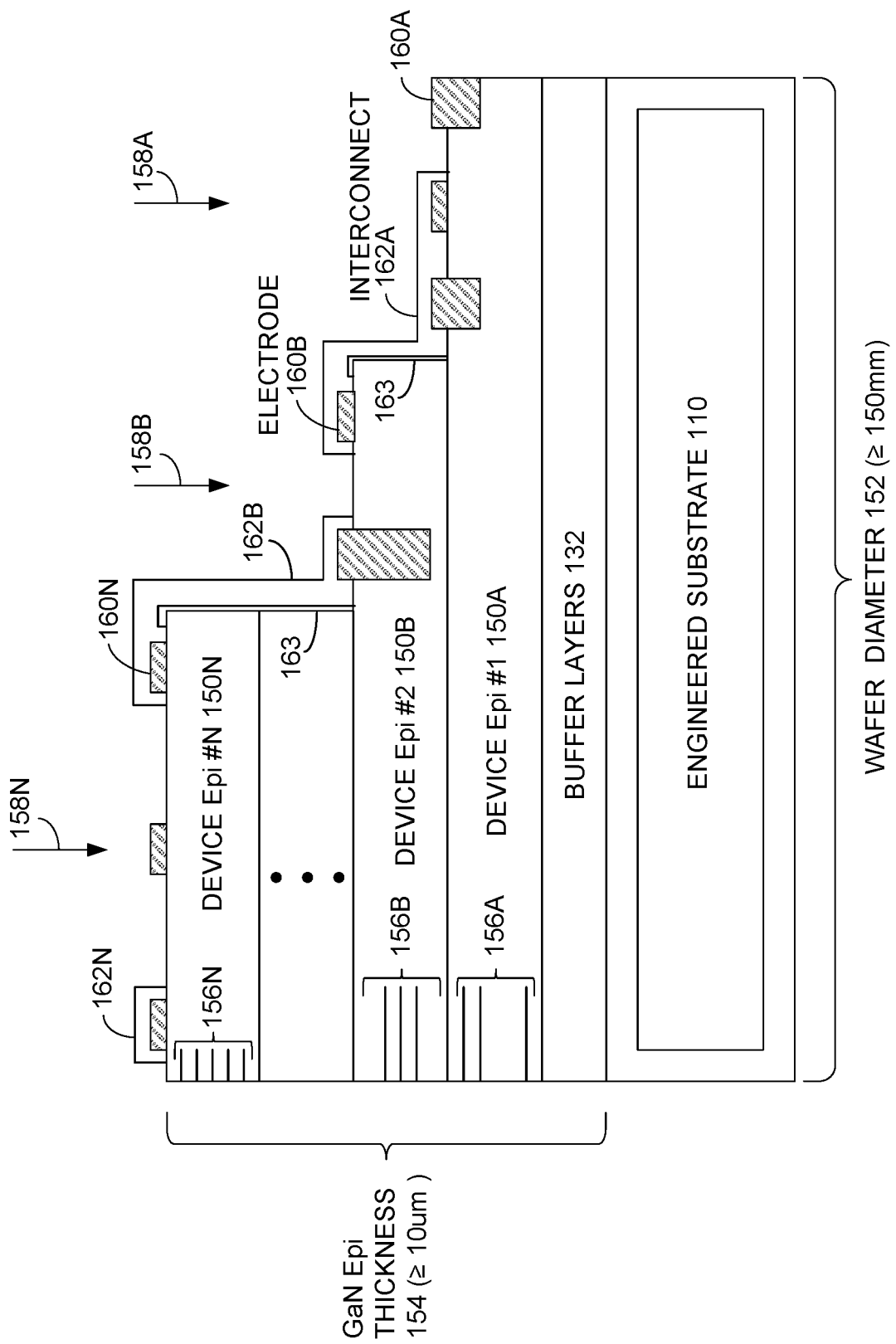
FIG. 2 is a side sectional view illustrating multiple GaN devices formed on the engineered substrate according to an embodiment of the present invention.

FIG. 2 is a side sectional view illustrating multiple GaN devices formed on the engineered substrate according to an embodiment of the present invention. As described herein, embodiments of the present invention can be referred to as GaN integrated circuit architectures. Referring to FIG. 2, one example of how multiple GaN devices are formed on engineered substrate (ES) 110 is illustrated. As explained above, CTE matching enables thicker GaN device formation on larger wafers. For example, the CTE matching enables formation of GaN devices 150 on an ES 110 with a wafer diameter 152 equal or greater than around 150 millimeter (i.e., approximately 6 inches or more). The CTE matching also enables a thicker combined GaN epi thickness 154 on ES 110 equal or greater than around 10 µm.

Larger wafer diameter 152 enables formation of more die on the same substrate. Greater GaN epi thickness 154 enables vertical formation of more devices 150 with more complex integrated circuitry on each die. Of course, wafer diameter 152 and GaN epi thickness 154 both may be larger or smaller. The combination of wafer diameter greater than 150 mm and GaN epi (not limited to GaN, but including GaN-based materials, such as InGaN, AlGaN, doped materials, other stoichiometry combinations, and the like) thickness greater than 10 µm is not available using conventional techniques, as a result, for example, of CTE mismatch between the substrate and the epitaxial layers. Using conventional techniques, including the use of sapphire substrates, the wafer diameter and epi thickness for wide bandgap materials are limited to less than 150 mm and 10 µm, respectively, because of cracking of the epi layers, and the like.

Devices 150A-150N are each formed with one or more groups of GaN epi layers 156. For example, epi layers 156A for GaN device 150A are applied on top of buffer layer 132. Epi layers 156B for GaN device 150B are applied on top of epi layers 156A for GaN device 150A. Any number of additional epi layers 156N for any number of additional GaN devices up to GaN device 150N are formed on top of epi layers 156A and 156B. The vertical integration of the epi layers and the devices formed therein, enables the monolithic integration of multiple different devices in a single integrated circuit architecture. As described herein, these devices can include electronic devices including diodes, transistors, unipolar devices, bipolar devices, and the like, as well as optoelectronic devices including light emitting diodes, lasers, detectors, phase modulators, waveguides, and the like. Lateral interconnects can be utilized to connect one or more devices to form integrated circuits. One of ordinary skill in the art would recognize many variations, modifications, and alternatives.

After formation of epi layers 156, a first etching process 158A etches down to epi layers 156A for GaN device 150A. For example, a mask may be located over left and center portions of epi layers 156. A chemical, vapor, or laser etching process 158A etches through epi layers 156N-156B down to epi layers 156A.

A set of mesas, interconnects, and electrodes 160A are then formed on one or more of epi layers 156A. For example, mesas and interconnects may extend down to one or more GaN epi layers 156A. Electrodes 160A are then formed on the interconnects configuring GaN epi layers 156A into device 150A.

A second etching stage 158B may etch down to epi layers 156B for GaN device 150B. For example, a mask may be located over left and right lateral portions of epi layers 156. A wet etch or dry etch processes are used to etch through epi layers 156N down to epi layers 156B. A second set of mesas, interconnects, and electrodes 160B configure GaN epi layers 156B into GaN device 150B. Etching stages 158 are repeated for each group of epi layers 156 forming different devices 150.

Interconnects 162 are formed in between or after etching stages 158. A mask is placed over areas where no interconnects 162 are desired. Interconnects 162 are then formed over the exposed surfaces interconnecting electrodes 160. For example, interconnect 162A connects some of electrodes 160A for GaN device 150A with some of electrodes 160B for GaN device 150B.

In the same or in a different process, interconnect 162B is formed on top of devices 150B and 150N and connects some of electrodes 160B for device 150B with some of electrodes 160N for device 150N. In the same or in a different process, interconnect 162N connects other electrodes 160N on device 150N with electrodes on other devices 150. Another process may form insulation layers 163 underneath interconnects 162A and 162B to electrically isolate the different devices 150.

Each group of epi layers 156 may form any type of unipolar or bipolar GaN devices 150 with any combination of n-doped or p-doped regions. Epi layers 156 may form any combination of electronic devices, optoelectronic devices, power devices, and/or RF devices.

An alternative N device epi structure deploys a "selective epi" process as an alternative to post epi etching processes 158A, 158B and 158N. In the selective epi approach, after deposition of epi #1 device 150A, the surface of the wafer is masked with an organized pattern to prevent subsequent GaN deposition on the masked areas.

After masking, epi #2 device 150B is deposited. Masked areas on the surface of epi #1 device do not receive any deposition of epi #2 device. This iterative selective epi process may be repeated N times to create the mesa structure shown in FIG. 2. Electrodes 160, insulation layers 163, interconnects 162 are formed after completion of the iterative selective epi process in some embodiments.

Figure 3:
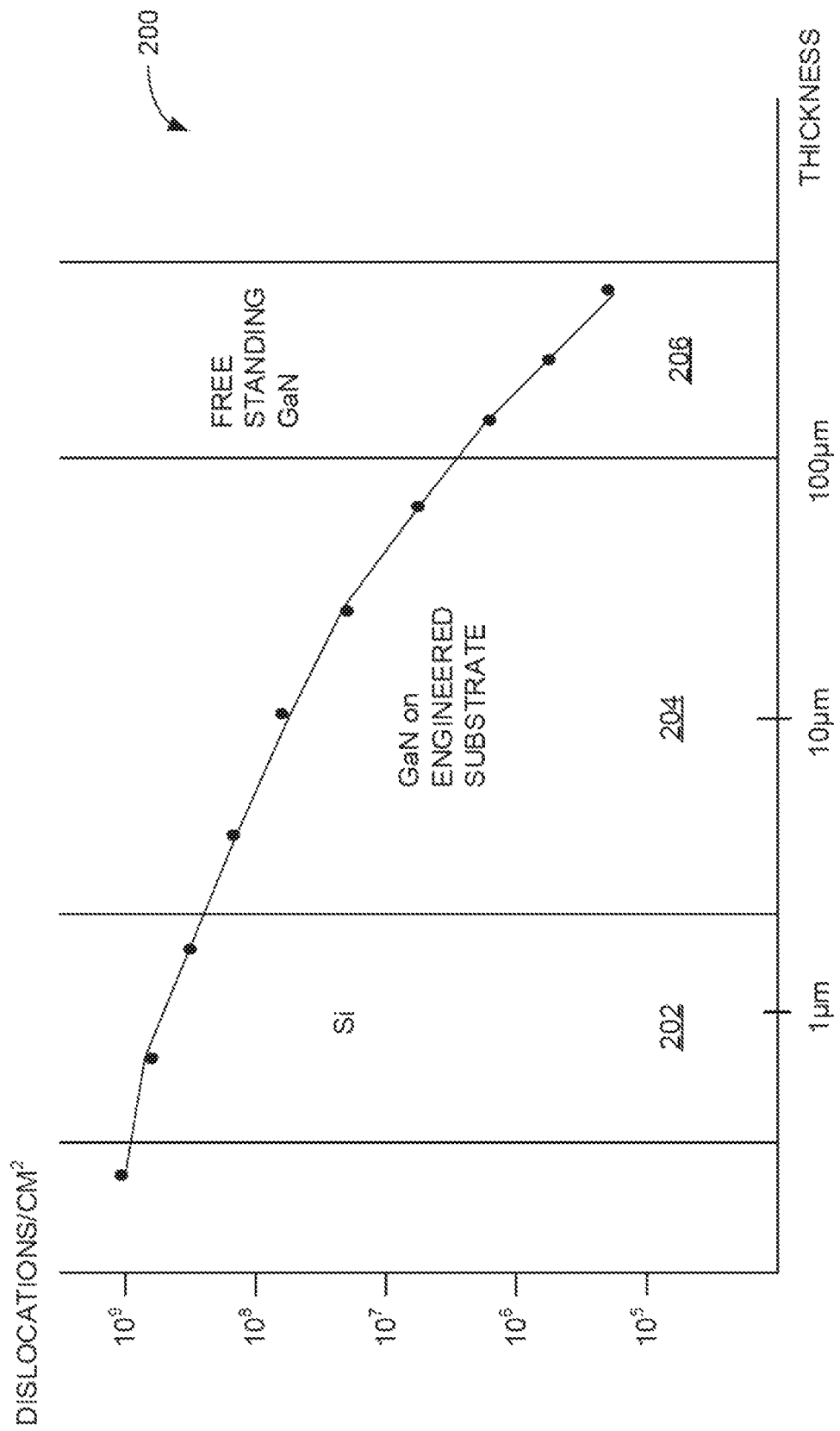
FIG. 3 is a plot illustrating dislocation density as a function of GaN epitaxial structure thickness.

FIG. 3 is a plot illustrating dislocation density as a function of GaN epitaxial structure thickness. As shown in FIG. 3, changes in dislocation density are associated with different GaN epi thicknesses. Graph 200 includes an X axis that represents GaN thickness in microns (µm) and a Y axis that represents dislocation density per square centimeter ($cm^2$).

In general, growing thicker GaN layers reduces overall dislocation density in the epi layers. In addition, various dislocation reduction techniques, such as interlayers or superlattices, can be applied if a greater thickness of GaN can be deposited without cracking. For example, range 202 in graph 200 represents a GaN epi formed on a silicon substrate. Due to the lattice and CTE mismatch, a GaN epi formed on a Si substrate has a limited thickness of only around 2 µm before significant cracking occurs. The limited GaN thickness results in a relatively high dislocation density of around $10^9/cm^2$.

Range 206 shows the dislocation density for a free standing GaN epi formed on a GaN substrate. The free standing GaN may have an overall thickness of 100 µm or more and have a relatively low dislocation density of around $10^6$-$10^4/cm'$. However, devices on free standing GaN substrates are expensive to produce due to very high cost, low quality and extreme fragility of such substrates.

Range 204 represents a bulk-like region where the GaN epi is formed on the engineered substrate described above in relation to FIGS. 1 and 2. The bulk-like GaN epi may have a relatively large thickness range between few microns and 100 microns or more, with a relatively low dislocation density of $10^8$-$10^6/cm^2$. As shown in graph 200, the GaN epi formed on the engineered substrate described above may produce dislocation densities similar to free standing GaN devices. The bulk-like GaN in region 204 has the additional advantage of fabrication on a large diameter engineered substrate (6 inch, 8 inch, 12 inch, or larger). Thus, the bulk-like GaN epi is substantially less expensive to manufacture than devices on a free standing GaN substrate. On the other hand, bulk-like epi has significantly higher performance (e.g. dislocation density) then thin epi deposited on CTE-mismatched substrates, for example, a Si substrate.

Figure 4:
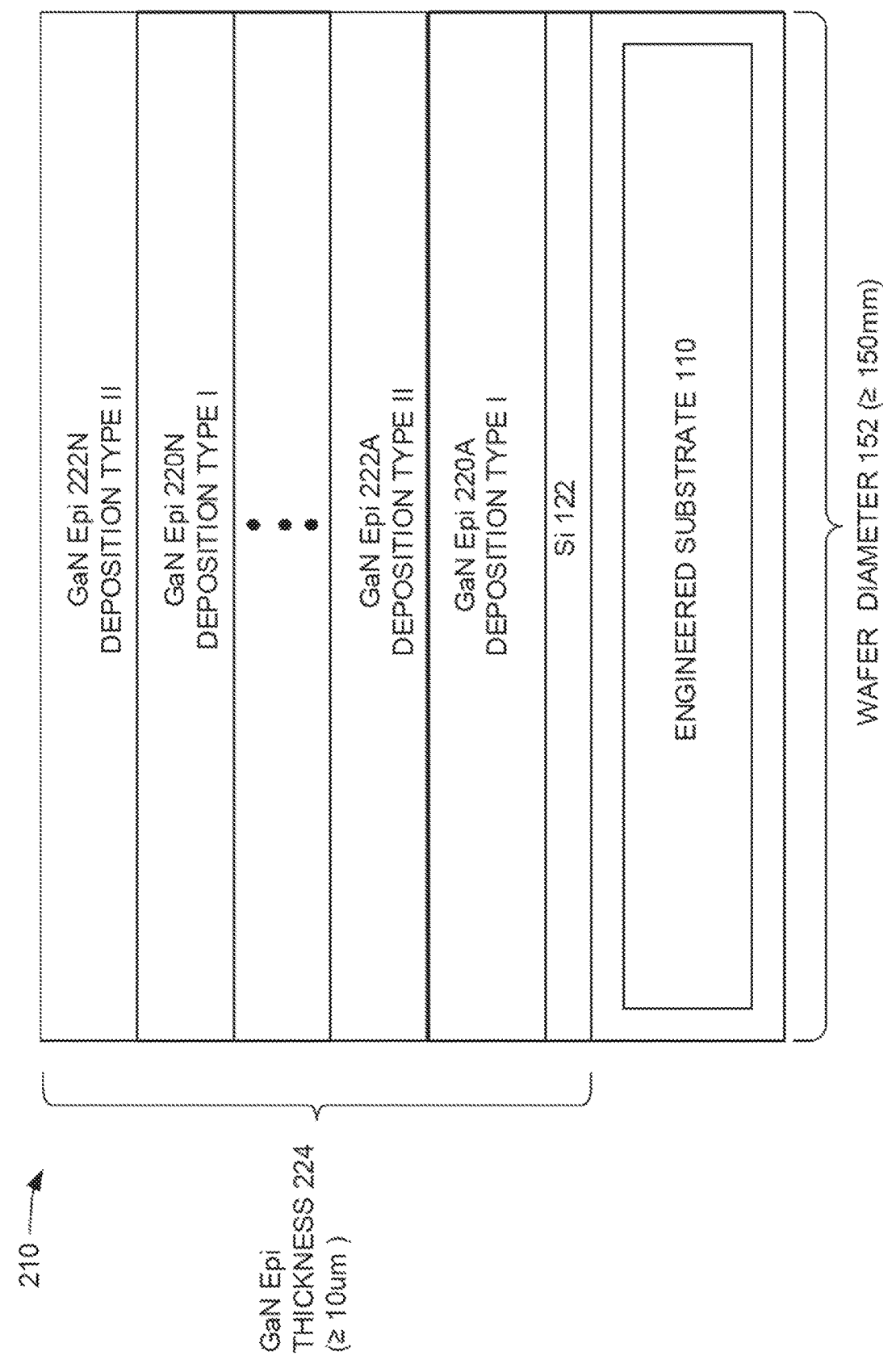
FIG. 4 is a side sectional view of a GaN device utilizing different deposition processes according to an embodiment of the present invention.

FIG. 4 is a side sectional view of a GaN device utilizing different deposition processes according to an embodiment of the present invention. In the embodiment illustrated in FIG. 4, multiple, different epitaxial deposition processes are used to form multiple, different GaN epi layers 220 and 222 on CTE-matched engineered substrate 110. Each GaN epi layer 220 and 222 may have a thickness of more than 1 µm with a combined thickness of 10 µm or more. As described above in relation to FIGS. 1 and 2, engineered substrate 110 may have a diameter of more than 150 millimeters and use a core CTE material that CTE matches GaN epi layers 220 and 222.

In one example, a metalorganic chemical vapor deposition (MOCVD) process forms deposition type I GaN epi layers 220 and a hybrid vapor phase epitaxy (HVPE) deposition process forms deposition type II GaN epi layers 222. In one example, each deposition type II GaN epi layer 222 (e.g., an HVPE layer) may be formed on an associated deposition type I GaN epi layer 220 (e.g., an MOCVD layer), which may be referred to as an interface layer. The alternating deposition processes used in deposition type I GaN epi layers 220 and deposition type II GaN epi layers 222 are used for fabricating multiple GaN devices 210 as described above in relation to FIGS. 1 and 2. In one example, either or both of deposition type I GaN epi layers or deposition type II GaN epi layers comprise a multi-layer stack of AlN, AlGaN, and/or GaN epi layers.

Although GaN epi layers are illustrated in FIG. 4, it will be appreciated that embodiments of the present invention are not limited to gallium nitride and can include group III-nitride materials, including AlN, GaN, AlGaN, combinations thereof, and the like. Therefore, the description related to GaN and GaN-based materials is intended to cover III-N-based materials including $Al_xGa_{1-x}N$ epitaxial materials. One of ordinary skill in the art would recognize many variations, modifications, and alternatives.

The bulk-like GaN devices 210 formed according to embodiments of the present invention may have an overall thickness 224 from several microns to more than 100 µm. The multi-deposition process produces high quality/low dislocation density GaN layers 220 and 222 on a large diameter engineered substrate 110. The greater overall thickness 224 of GaN devices 210 provides a low dislocation density suitable for power electronic devices in lateral or vertical architectures.

Figure 5:
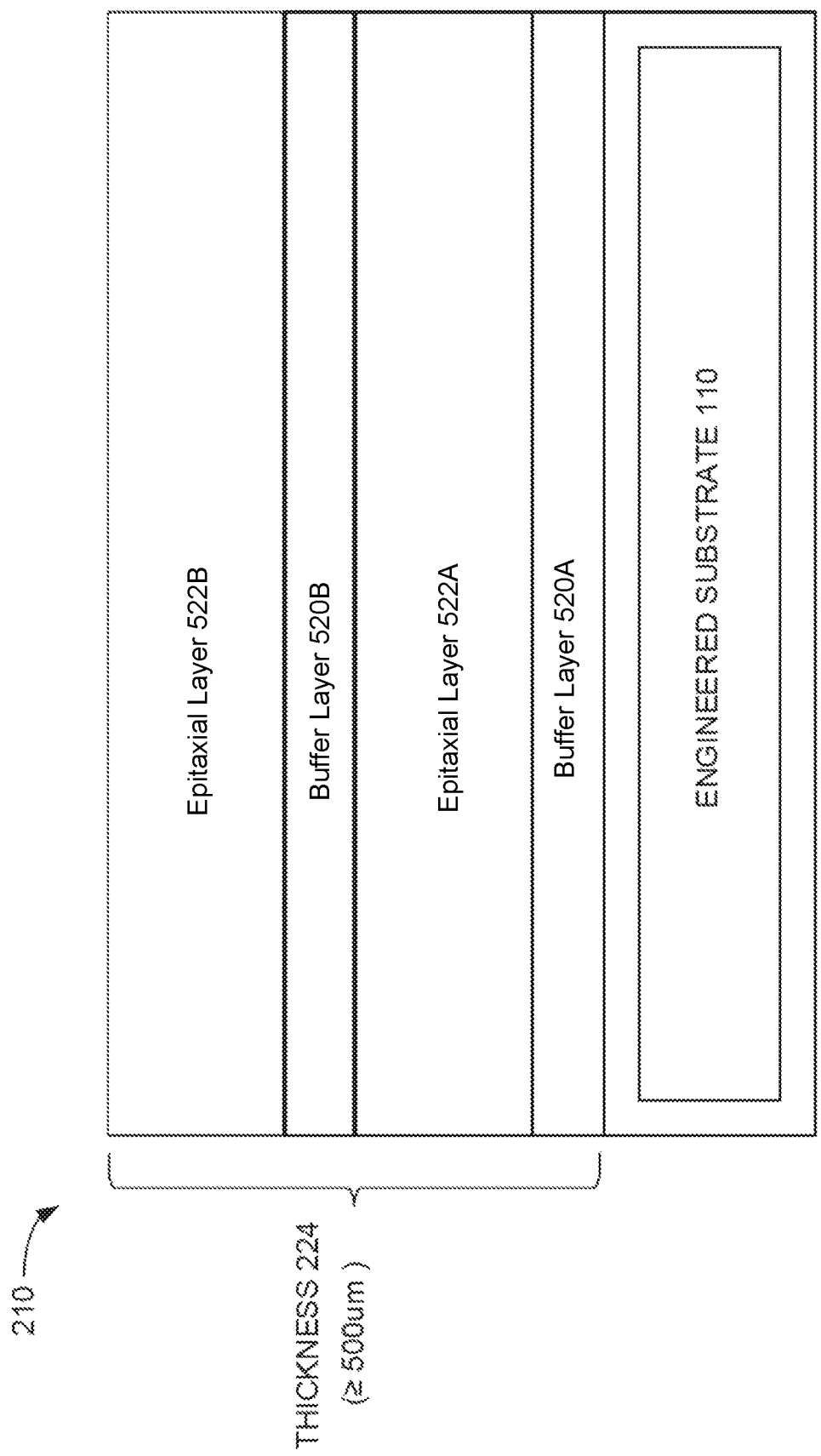
FIG. 5 is a side section view illustrating a version of the GaN device shown in FIG. 4 in additional detail according to an embodiment of the present invention.

FIG. 5 is a side section view illustrating a version of the GaN device shown in FIG. 4 in additional detail according to an embodiment of the present invention. In particular, FIG. 5 highlights the GaN device 210 fabricated using the hybrid-deposition process described herein in additional detail. In the embodiment illustrated in FIG. 5, a metalorganic chemical vapor deposition (MOCVD) process is used to form buffer layer 520A coupled to (e.g., on top of) engineered substrate 110. In one example, buffer layer 520A is approximately 2-10 µm in thickness and may include a combination of aluminum nitride (AlN), aluminum gallium nitride (AlGaN), gallium nitride (GaN), combinations thereof, or the like. In one example, buffer layer 520A may have less than 5% AlN and be made up primarily of GaN.

Buffer layer 520A may operate as a crystal seed layer for a subsequent epitaxial growth process (e.g., an HVPE process) used to form a second epi layer and provide a GaN template surface for forming different GaN devices. Due to slow growth rates in some implementations, growing more than 10 µm of GaN epi with the MOVCD deposition process may be difficult and result in higher processing costs.

Epitaxial layer 522A (e.g., a hybrid vapor phase epitaxy (HVPE) layer) is coupled to buffer layer 520A and may be formed on top of buffer layer 520A. HVPE is a process that can deposit more high quality GaN epi material at a higher growth rate than the MOCVD process used for forming buffer layer 520A, which can also be referred to as an interface layer. For example, epitaxial layer 522A may provide a 20-50 µm/hour epi growth rate. Separate MOCVD and HVPE processes are known for forming GaN LEDs, HEMT, power devices, circuits, etc. and are therefore not described in further detail.

The inventors have determined that HVPE GaN layers can be more easily formed on MOCVD buffer layers than directly on a silicon surface, thereby producing a larger thickness 224. The inventors have also determined that the dislocation density can be decreased by approximately a factor of five by using a 5 µm MOCVD layer underneath a 30 µm HVPE layer 222.

Exemplary layers that can be implemented utilizing embodiments of the present invention include an initial MOCVD AlN buffer layer 1-2 µm thick as buffer layer 520A. Subsequently, an insulating buffer layer can be fabricated using HVPE, for example, a lightly doped n-type GaN layer (e.g., doped with iron or carbon) approximately 10 µm in thickness could be formed as epitaxial layer 522A. A lateral HEMT structure could be formed as epitaxial layer 520B using MOCVD, for example, including an AlGaN barrier layer and a GaN channel layer with a high level of control over the epitaxial layer thicknesses as a result of the MOCVD growth.

Another example would be suitable for use with vertical diode structures. This example can include an MOCVD AlN/AlGaN/GaN buffer layer similar to the previous example and a epitaxial layer 522B grown using HVPE including a heavily doped contact layer (e.g., n-type GaN doped at $1-5 \times 10^{18}$ cm$^{-3}$ and an n-type drift layer (e.g., n-type GaN doped at $5 \times 10^{15}$ cm$^{-3}$ to $2 \times 10^{16}$ cm$^{-3}$).

A third example can build off of the previous example of a vertical diode, adding a lateral HEMT structure as the epitaxial layer 520B. This will provide a vertical switch fabricated using the multiple, different epitaxial layers described herein.

Referring to FIG. 5, an additional GaN buffer layer 520B may be formed on top of GaN epi layer 522A and an additional GaN epi layer 522B may be formed on top of the additional GaN buffer layer 520B. As will be evident to one of skill in the art, any combination of buffer and epi layers (e.g., layers made using MOCVD and HVPE deposition processes) may be used to form any number of additional buffer and epi layers in order to increase the thickness 224. Although only two sets are illustrated in FIG. 5, additional sets can be implemented as appropriate to the particular application.

In some embodiments, bottom engineered substrate 110 is removed to form free standing GaN devices 210 with thicknesses 224 of up to or more than 500 µm. Due to the large thickness 224, GaN devices 210 have substantially reduced dislocation densities. Engineered substrate 110 also allows for the formation of GaN devices 210 on larger diameter wafers of six inches and larger for increased integration and reduced overall device cost.

Any combination of different GaN devices may be formed within each HVPE layer 222 as described above in FIGS. 1 and 2, such as different combinations of LEDs, power and RF HEMTs, etc. Additional dislocation density management techniques may be used, such as adding silicon nitride (SiN) interlayers, super lattice, and GaN/AlGaN layers between the various epi layers illustrated herein.

The multi-deposition process described above may be used in combination with any of the GaN device processes described in U.S. Patent Application Publication No. 2017/0110314, published on Apr. 20, 2017, entitled "Lift Off Process for Chip Scale Package Solid State Devices on Engineered Substrate," U.S. patent application Ser. No. 15/367,108, filed on Dec. 1, 2016, entitled "Wide Band Gap Device Integrated Circuit Architecture on Engineered Substrate," and U.S. patent application Ser. No. 15/491,779, filed on Apr. 19, 2017, entitled "Engineered Substrate Including Light Emitting Diode and Power Circuitry," the disclosures of which are hereby incorporated by reference in their entirety for all purposes.

Figure 6:
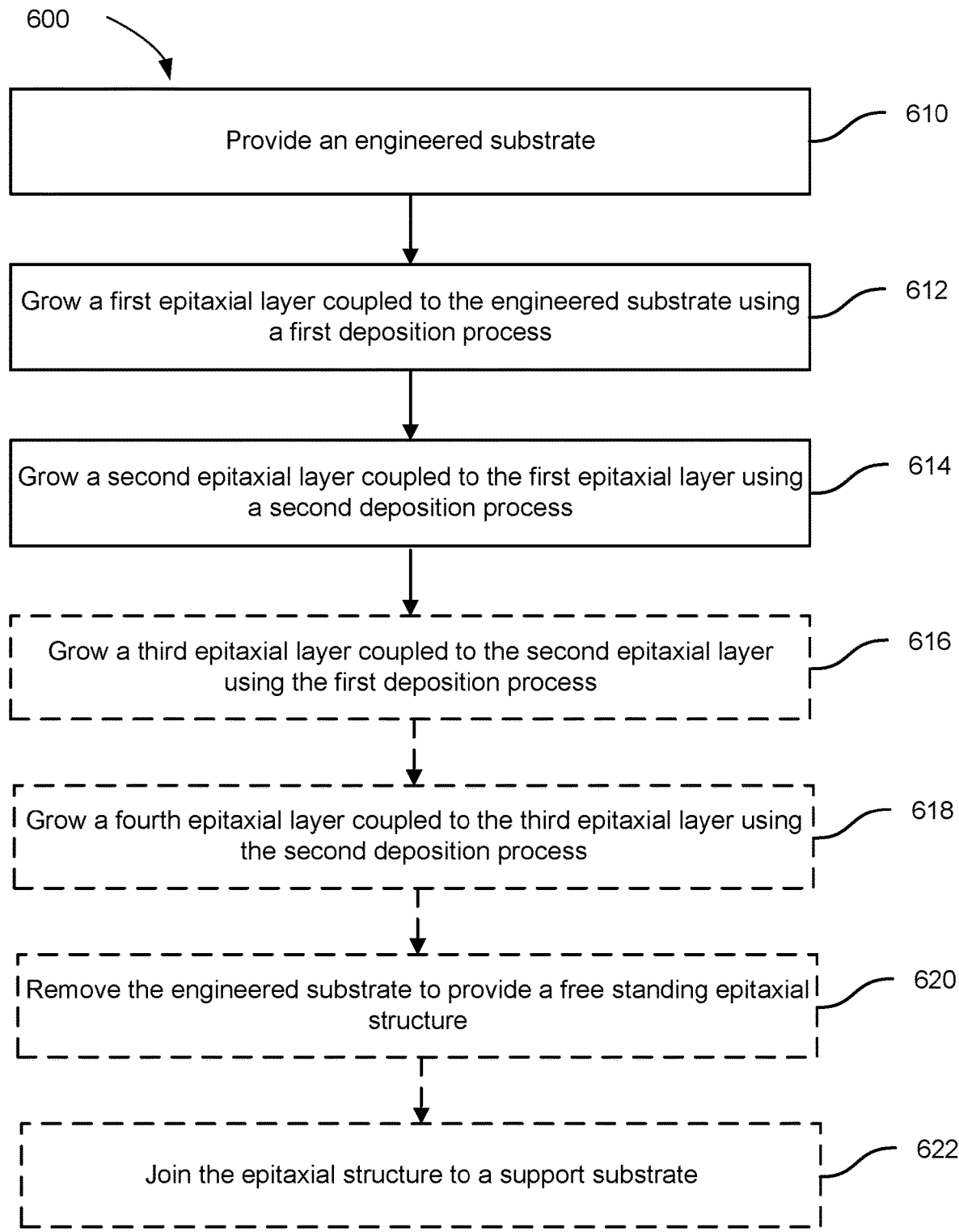
FIG. 6 is a simplified flowchart illustrating a method of forming a III-N-based epitaxial structure according to an embodiment of the present invention.

FIG. 6 is a simplified flowchart illustrating a method of forming a III-N-based epitaxial structure according to an embodiment of the present invention. The method includes providing an engineered substrate (610). Providing the engineered substrate can include providing a polycrystalline ceramic core, encapsulating the polycrystalline ceramic core in a first tetraethyl orthosilicate (TEOS) layer, encapsulating the first TEOS layer in a polysilicon layer, and encapsulating the polysilicon layer in a second TEOS layer, and encapsulating the second TEOS layer in a silicon nitride layer.

The method also includes growing a first epitaxial layer coupled to the engineered substrate using a first deposition process (612). In an embodiment, the first deposition process comprises a metalorganic chemical vapor deposition (MOCVD) process that is used to form III-N-based epitaxial layers, for example, AlN, GaN, or AlGaN epitaxial layers. The first epitaxial layer can consist of a single material (e.g., GaN) or can include multiple sub-layers (e.g., an AlN layer combined with a GaN and/or AlGaN layer). Thus, a plurality of sub-layers can be used to fabricate the first epitaxial layer.

The method further includes growing a second epitaxial layer coupled to the first epitaxial layer using a second deposition process (614). In an embodiment, the second deposition process comprises a hybrid vapor phase epitaxy (HVPE) process that is used to form III-N-based epitaxial layers, for example, AlN, GaN, or AlGaN epitaxial layers. The second epitaxial layer can consist of a single material (e.g., GaN) or can include multiple sub-layers (e.g., an AlN layer combined with a GaN and/or AlGaN layer). Thus, a plurality of sub-layers can be used to fabricate the second epitaxial layer.

In an embodiment, the method also includes growing a third epitaxial layer (e.g., an additional III-N-based layer including one or more sub-layers) coupled to the second epitaxial layer using the first deposition process (616) and growing a fourth epitaxial layer (e.g., an additional III-N-based layer including one or more sub-layers) coupled to the third epitaxial layer using the second deposition process (618). The process of depositing additional epitaxial layers using the first and second deposition processes can be repeated a predetermined number of times as appropriate to the particular application. Thus, as illustrated in FIG. 4, repeated sets of layers (e.g., MOCVD GaN-based epitaxial layer/HVPE GaN-based epitaxial layer) can be fabricated using embodiments of the present invention.

In an embodiment, the method further includes removing the engineered substrate to provide a free standing epitaxial substrate (620). Once the engineered substrate is removed, the free standing epitaxial structure can be joined to a support substrate (622) in order to facilitate further processing.

As described herein, the engineered substrate can be characterized by a substrate coefficient of thermal expansion (CTE), the first III-N-based epitaxial layer can be characterized by a first CTE, and the second III-N-based epitaxial layer can be characterized by a second CTE. In an embodiment, the substrate CTE, the first CTE, and the second CTE are substantially equal. For example, the substrate CTE, the first CTE, and the second CTE can be within about 0.1%, 0.5%, 1%, 2%, 5%, or 10% of each other over a predetermined temperature range, for example, from about 25° C. to about 1200° C. Thus, in the embodiments described herein, the engineered substrate, particularly the core of the engineered substrate, has a CTE that is substantially matched to the CTE of subsequent epitaxial layers.

The method can include, as illustrated in the embodiment shown in FIG. 4, providing a silicon layer coupled to the first epitaxial layer and disposed between the engineered substrate and the first epitaxial layer. The silicon layer is characterized by a CTE differing from the first CTE.

Figure 7:
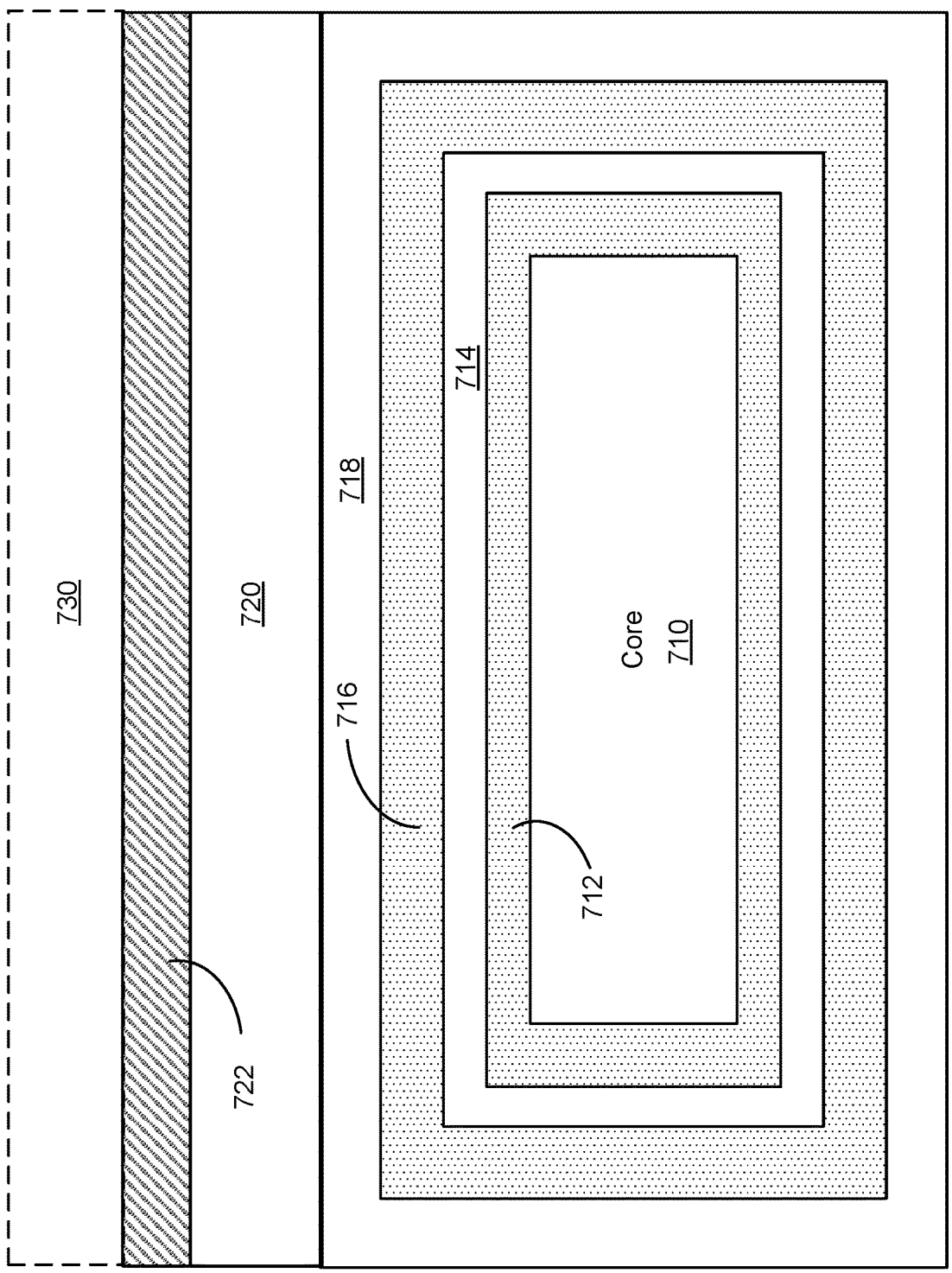
FIG. 7 is a simplified schematic diagram illustrating an engineered substrate structure according to an embodiment of the present invention.

FIG. 7 is a simplified schematic diagram illustrating an engineered substrate structure, according to an embodiment of the present invention. ES 700 illustrated in FIG. 7 is suitable for a variety of electronic and optical applications. ES 700 includes a core 710 that can have a coefficient of thermal expansion (CTE) that is substantially matched to the CTE of the epitaxial material that will be grown on ES 700. A GaN epitaxial layer 730 is illustrated as optional because it is not required as an element of ES 700, but will typically be grown on ES 700.

For applications including the growth of gallium nitride (GaN)-based materials (epitaxial layers including GaN-based layers), core 710 can be a polycrystalline ceramic material, for example, polycrystalline aluminum nitride (AlN), which may include binding agents, such as yttrium oxide. Other materials can be utilized as core 710, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like. The thickness of core 710 can be on the order of 100 to 1,500 µm, for example, 750 µm.

Core 710 may be encapsulated in a first adhesion layer 712 that can be referred to as a shell or an encapsulating shell. In an embodiment, first adhesion layer 712 comprises a tetraethyl orthosilicate (TEOS) oxide layer on the order of 1,000 Å in thickness. In other embodiments, the thickness of first adhesion layer 712 varies, for example, from 100 Å to 2,000 Å. Although TEOS oxides can be utilized for adhesion layers in some embodiments, other materials that provide for adhesion between later deposited layers and underlying layers or materials (e.g., ceramics, in particular, polycrystalline ceramics) can be utilized according to other embodiments of the present invention. For example, $SiO_2$ or other silicon oxides ($Si_xO_y$) may adhere well to ceramic materials and may provide a suitable surface for subsequent deposition, for example, of conductive materials. In some embodiments, first adhesion layer 712 completely surrounds core 710 in some embodiments to form a fully encapsulated core and can be formed using an LPCVD process or other suitable deposition processes, which can be compatible with semiconductor processing, and in particular, with polycrystalline or composite substrates and layers. In some embodiments, first adhesion layer 712 may be formed on one side of core 710. First adhesion layer 712 provides a surface on which subsequent layers adhere to form elements of the engineered substrate structure.

In addition to the use of LPCVD processes, spin on glass/dielectrics, furnace-based processes, and the like, to form the encapsulating adhesion layer, other semiconductor processes can be utilized according to embodiments of the present invention, including CVD processes or similar deposition processes. As an example, a deposition process that coats a portion of the core can be utilized; the core can be flipped over, and the deposition process could be repeated to coat additional portions of the core. Thus, although LPCVD techniques are utilized in some embodiments to provide a fully encapsulated structure, other film formation techniques can be utilized, depending on the particular application.

A conductive layer 714 is formed on first adhesion layer 712. In an embodiment, conductive layer 714 is a shell of polysilicon (i.e., polycrystalline silicon) that is formed surrounding first adhesion layer 712 since polysilicon can exhibit poor adhesion to ceramic materials. In embodiments in which conductive layer 714 is polysilicon, the thickness of the polysilicon layer can be on the order of 500-5,000 Å, for example, 2,500 Å. In some embodiments, the polysilicon layer can be formed as a shell to completely surround first adhesion layer 712 (e.g., a TEOS oxide layer), thereby forming a fully encapsulated adhesion layer, and can be formed using an LPCVD process. In other embodiments, the conductive material can be formed on a portion of the adhesion layer, for example, an upper half of the substrate structure. In some embodiments, the conductive material can be formed as a fully encapsulating layer and can be subsequently removed on one side of the substrate structure.

In an embodiment, conductive layer 714 can be a polysilicon layer doped to provide a highly conductive material. for example, conductive layer 714 may be doped with boron to provide a p-type polysilicon layer. In some embodiments, the doping with boron is at a level of $1\times10^{19}$ $cm^{-3}$ to $1\times10^{20}$ $cm^{-3}$ to provide for high conductivity. Other dopants at different dopant concentrations (e.g., phosphorus, arsenic, bismuth, or the like at dopant concentrations ranging from $1\times10^{16}$ $cm^{-3}$ to $5\times10^{18}$ $cm^{-3}$) can be utilized to provide either n-type or p-type semiconductor materials suitable for use in the conductive layer. One of ordinary skill in the art would recognize many variations, modifications, and alternatives.

The presence of conductive layer 714 is useful during electrostatic chucking of the engineered substrate to semiconductor processing tools, for example tools with electrostatic chucks (e-chucks or ESC). Conductive layer 714 enables rapid dechucking after processing in the semiconductor processing tools. In embodiments of the present invention, the conductive layer enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with electrostatic chucking may provide better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 716 (e.g., a TEOS oxide layer on the order of 1,000 Å in thickness) is formed on conductive layer 714. Second adhesion layer 716 completely surrounds conductive layer 714 in some embodiments to form a fully encapsulated structure and can be formed using an LPCVD process, a CVD process, or any other suitable deposition process, including the deposition of a spin-on dielectric.

A barrier layer 718, for example, a silicon nitride layer, is formed on second adhesion layer 716. In an embodiment, barrier layer 718 is a silicon nitride layer that is on the order of 4,000 Å to 5,000 Å in thickness. Barrier layer 718 completely surrounds the second adhesion layer in some embodiments to form a fully encapsulated structure and can be formed using an LPCVD process. In addition to silicon nitride layers, amorphous materials including SiCN, SiON, AlN, SiC, and the like can be utilized as the barrier layers. In some implementations, barrier layer 718 includes a number of sub-layers that are built up to form barrier layer 718. Thus, the term barrier layer is not intended to denote a single layer or a single material, but is to encompass one or more materials layered in a composite manner. One of ordinary skill in the art would recognize many variations, modifications, and alternatives.

In some embodiments, barrier layer 718, e.g., a silicon nitride layer, prevents diffusion and/or outgassing of elements present in the core, for example, yttrium (elemental), yttrium oxide (i.e., yttria), oxygen, metallic impurities, other trace elements, and the like, into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN, that are designed for non-clean room environments, can be utilized in semiconductor process flows and clean room environments.

In some embodiments, ceramic materials utilized to form the core may be fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which may be conducted at much lower temperatures in the range of 800° C. to 1,100° C., it would be expected that the subsequent diffusion of these impurities would be insignificant. However, contrary to conventional expectations, even during epitaxial growth processes at temperatures much lower than the firing temperature of the ceramic materials, significant diffusion of elements through the layers of the engineered substrate may be present. Thus, embodiments of the present invention integrate the barrier layer into the engineered substrate structure to prevent this undesirable diffusion.

Thus, embodiments of the present invention integrate a silicon nitride layer to prevent out-diffusion of the background elements from the polycrystalline ceramic material (e.g., AlN) into the engineered layers and epitaxial layers such as an optional GaN epitaxial layer 730. The silicon nitride layer encapsulating the underlying layers and material provides the desired barrier layer 718 functionality. The integration of the silicon nitride layer into the engineered substrate structure prevents the diffusion of calcium, yttrium, and aluminum into the engineered layers during the annealing process that occurred when the silicon nitride layer was not present. Thus, the use of the silicon nitride layer as the barrier layer 718 prevents these elements from diffusing through the diffusion barrier and thereby prevents their release into the environment surrounding the engineered substrate. Similarly, any other impurities containing within the bulk ceramic material would be contained by the barrier layer.

A bonding layer 720 (e.g., a silicon oxide layer) may be deposited on a portion of barrier layer 718, for example, on the top surface of barrier layer 718, and subsequently used during the bonding of a substantially single crystal layer 722 (e.g., a single crystal silicon layer such as exfoliated silicon (111) layer). Bonding layer 720 can be approximately 1.5 µm in thickness in some embodiments. In some embodiments, the thickness of bonding layer 720 is 20 nm or more for bond-induced void mitigation. In some embodiments, the thickness of bonding layer 720 is in the range of 0.75-1.5 µm.

Bonding layer 720 can be formed by a deposition of a thick (e.g., 2-5 µm thick) oxide layer followed by a chemical mechanical polishing (CMP) process to thin the oxide to approximately 1.5 µm or less in thickness. The thick initial oxide serves to smooth surface features present on the support structure that may remain after fabrication of the polycrystalline core and continue to be present as the encapsulating layers illustrated in FIG. 1 are formed. The CMP process provides a substantially planar surface free of voids, which can then be used during a wafer transfer process to bond single crystal layer 722 to bonding layer 720.

The substantially single crystal layer 722 (e.g., exfoliated Si (111)) is suitable for use as a growth layer during an epitaxial growth process for the formation of epitaxial materials. In some embodiments, the epitaxial material can include a GaN layer of 2 µm to 10 µm in thickness, which can be utilized as one of a plurality of layers utilized in optoelectronic, RF, and power devices. In an embodiment, substantially single crystal layer 722 includes a single crystal silicon layer that is attached to the bonding layer using a layer transfer process.

A layer transfer process may be performed using a silicon wafer. The silicon wafer may be implanted with several elements to create a damage interface inside Si, which may help to form single crystal layer 722 for attaching to bonding layer 720. For example, applying pressure on the silicon wafer and bonding layer 720 that are attached together may atomically bond the silicon wafer to bonding layer 720.

After the bonding process, an exfoliation process may activate the damage interface inside the silicon wafer and cause the implanted elements in single crystal layer 722 to expand, thus splitting the top portion of the silicon wafer from ceramic core 710 with engineered layers. Remaining single crystal layer 722 bonded to bonding layer 720 may be relatively thin, such as less than around 5 microns, and therefore may not significantly contribute to the CTE of ES 700. The CTE of ES 700 is therefore primarily determined by the CTE of ceramic core 710.

Materials other than silicon may be used to create a single crystal thin bonding layer. These single crystal materials may include SiC, GaN, AlGaN, AlN, ZnO, sapphire, and other.

GaN epitaxial layer 730 (which may also be referred to as epitaxial layers) can be formed by epitaxially growing a number of layers or sub-layers to form an epitaxial structure on top of ES 700. As used herein, the term "layer" should be understood to include a structure including multiple layers or sub-layers of the same or different materials. In some embodiments, a buffer layer may be formed on bonding layer 720, and GaN epitaxial layer 730 (epitaxial layers) may be formed on top of the buffer layer. The CTEs of ceramic core 710 and GaN epitaxial layer 730 may be substantially matched over a wide temperature range (e.g., from about 25° C. to about 1200° C.), such as within about 0.1%, 0.5%, 1%, 2%, 5%, or 10% of each other. This CTE matching enables the formation of higher quality epitaxial layers on larger ceramic wafers without cracking or warping. For example, GaN epitaxial layer 730 may be formed on an ES 700 of 6-inch, 8-inch, 12-inch, or larger. Using larger wafers may increase the device count per wafer and thus result in less expensive GaN devices.

The CTE matching may also enable the formation of a significantly thicker GaN epitaxial layer 730 (e.g., tens or hundreds of microns) on top of ES 700. The combined epitaxial layers may reduce the overall dislocation density of the lattice structures between GaN epitaxial layer 730 and single crystal layer 722. In addition, a larger number of epitaxial layers can be used to fabricate more complex circuitry for a wider array of GaN devices.

Additional description related to engineered substrates is provided in U.S. patent application Ser. No. 15/612,338, filed on Jun. 13, 2017, and Ser. No. 15/621,235, filed on Jun. 13, 2017, and U.S. Provisional Patent Application No. 62/461,722, filed on Feb. 21, 2017, the disclosures of which are hereby incorporated by reference in their entirety for all purposes.

According to an embodiment of the present invention, an epitaxial structure is provided. The epitaxial structure includes an engineered substrate and a single crystal layer joined to the engineered substrate. The engineered substrate can include a polycrystalline ceramic core, a first tetraethyl orthosilicate (TEOS) layer encapsulating the polycrystalline ceramic core, a polysilicon layer encapsulating the first TEOS layer, a second TEOS layer encapsulating the polysilicon layer, and a silicon nitride layer encapsulating the second TEOS layer. The epitaxial structure also includes a first set of III-N epitaxial layers coupled to the single crystal layer and a second set of III-N epitaxial layers coupled to the first set of III-N epitaxial layers.

As an example, the first set of III-N epitaxial layers comprise GaN and the second set of III-N epitaxial layers can include GaN. In some embodiments, the diameter of the engineered substrate is greater than 150 mm and the combined thickness of the first set of III-N epitaxial layers and the second set of III-N epitaxial layers is greater than 10 µm. One or more isolating III-N epitaxial layers can be disposed between the first set of III-N epitaxial layers and the second set of III-N epitaxial layers. Additionally, one or more buffer layers can be disposed between the single crystal layer and the first set of III-N epitaxial layers.

The epitaxial structure can include III-N epitaxial layers that are suitable for implementation of a transistor and additional III-N epitaxial layers includes layers that are suitable for implementation of a light emitter.

The specific details of the specific aspects of implementations disclosed herein may be combined in any suitable manner without departing from the spirit and scope of the disclosed implementations. However, other implementations may be directed to specific implementations relating to each individual aspect, or specific combinations of these individual aspects.

While some implementations have been described herein, it should be understood that they have been presented by way of example only, and not limitation. Thus, the breadth and scope of the present application should not be limited by any of the implementations described herein, but should be defined only in accordance with the following and later-submitted claims and their equivalents.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A group III-nitride (III-N)-based electronic device comprising:
   an engineered substrate comprising:
      a polycrystalline ceramic core;
      a conductive layer coupled to the polycrystalline ceramic core; and
      a barrier layer encapsulating the conductive layer and the polycrystalline ceramic core, the barrier layer being non-metallic;
   a single crystalline silicon layer coupled to the engineered substrate;
   a metalorganic chemical vapor deposition (MOCVD) III-N-based epitaxial layer coupled to the single crystalline silicon layer; and
   a hybrid vapor phase epitaxy (HVPE) III-N-based epitaxial layer coupled to the MOCVD epitaxial layer.

2. The III-N-based electronic device of claim 1 wherein the engineered substrate further comprises:
   a first adhesion layer coupled to the polycrystalline ceramic core, the first adhesion layer being non-metallic, wherein the conductive layer is coupled to the first adhesion layer; and
   a second adhesion layer coupled to the conductive layer, the second adhesion layer being non-metallic, wherein the barrier layer encapsulates the second adhesion layer.

3. The III-N-based electronic device of claim 1 wherein the conductive layer is formed on only one side of the engineered substrate.

4. The III-N-based electronic device of claim 1 wherein the conductive layer encapsulates the engineered substrate.

5. The III-N-based electronic device of claim 1 further comprising:
   a second MOCVD III-N-based epitaxial layer coupled to the HVPE III-N-based epitaxial layer; and
   a second HVPE III-N-based epitaxial layer coupled to the second MOCVD based epitaxial layer.

6. The III-N-based electronic device of claim 1 wherein:
   the MOCVD III-N-based epitaxial layer comprises at least one of AlN, GaN, or AlGaN; and
   the HVPE III-N-based epitaxial layer comprises at least one of AlN, GaN, or AlGaN.

7. A method of fabricating a epitaxial structure, the method comprising:
   providing an engineered substrate, the engineered substrate comprising:
      a polycrystalline ceramic core;
      a conductive layer coupled to the polycrystalline ceramic core; and
      a barrier layer encapsulating the conductive layer and the polycrystalline ceramic core, the barrier layer being non-metallic;
   transferring a single crystalline silicon layer coupled to the engineered substrate;
   growing a first epitaxial layer coupled to the engineered substrate using a first deposition process; and growing a second epitaxial layer coupled to the first epitaxial layer using a second deposition process.

8. The method of claim 7 wherein the engineered substrate further comprises:
a first adhesion layer coupled to the polycrystalline ceramic core, the first adhesion layer being non-metallic, wherein the conductive layer is coupled to the first adhesion layer; and
a second adhesion layer coupled to the conductive layer, the second adhesion layer being non-metallic, wherein the barrier layer encapsulates the second adhesion layer.

9. The method of claim 7 wherein the conductive layer is formed on only one side of the engineered substrate.

10. The method of claim 7 wherein the conductive layer encapsulates the engineered substrate.

11. The method of claim 7 further comprising:
growing a third epitaxial layer coupled to the second epitaxial layer using the first deposition process; and
growing a fourth epitaxial layer coupled to the third epitaxial layer using the second deposition process.

12. The method of claim 7 wherein the first deposition process comprises a metalorganic chemical vapor deposition (MOCVD) process and the second deposition process comprises a hybrid vapor phase epitaxy (HVPE) process.

13. The method of claim 7 wherein:
the first epitaxial layer comprises at least one of AlN, GaN, or AlGaN; and
the second epitaxial layer comprises at least one of AlN, GaN, or AlGaN.

14. A method of forming a GaN-based epitaxial structure, the method comprising:
providing an engineered substrate, the engineered substrate comprising:
a polycrystalline ceramic core;
a conductive layer coupled to the polycrystalline ceramic core; and
a barrier layer encapsulating the conductive layer and the polycrystalline ceramic core, the barrier layer being non-metallic;
transferring a single crystalline silicon layer coupled to the engineered substrate;
depositing a first GaN-based epitaxial layer coupled to the single crystalline silicon layer using a metalorganic chemical vapor deposition (MOCVD) process; and
depositing a second GaN-based epitaxial layer coupled to the first GaN-based epitaxial layer using a hybrid vapor phase epitaxy (HVPE) deposition process.

15. The method of claim 14 wherein the engineered substrate further comprises:
a first adhesion layer coupled to the polycrystalline ceramic core, the first adhesion layer being non-metallic, wherein the conductive layer is coupled to the first adhesion layer; and
a second adhesion layer coupled to the conductive layer, the second adhesion layer being non-metallic, wherein the barrier layer encapsulates the second adhesion layer.

16. The method of claim 14 wherein the conductive layer is formed on only one side of the engineered substrate.

17. The method of claim 14 wherein the conductive layer encapsulates the engineered substrate.

18. The method of claim 14 further comprising:
depositing an additional MOCVD GaN-based epitaxial layer using an MOCVD process:
depositing an additional HVPE GaN-based epitaxial layer using a HVPE deposition process; and
repeating depositing an additional MOCVD GaN-based epitaxial layer and depositing an additional HVPE GaN-based epitaxial layer a predetermined number of times.

19. The method of claim 14 wherein:
the engineered substrate is characterized by a substrate coefficient of thermal expansion (CTE);
the first GaN-based epitaxial layer is characterized by a first CTE;
the second GaN-based epitaxial layer is characterized by a second CTE; and
the substrate CTE, the first CTE, and the second CTE are substantially equal.

20. The method of claim 14 wherein:
the first GaN-based epitaxial layer comprises $Al_xGa_{1-x}N$; and
the second GaN-based epitaxial layer comprises $Al_xGa_{1-x}N$.

* * * * *